Jan. 6, 1970 F. E. WELD 3,488,619

PLUG-IN ELECTRIC CIRCUIT COMPONENT

Filed Dec. 21, 1966

INVENTOR.
FOSTER E. WELD

United States Patent Office 3,488,619
Patented Jan. 6, 1970

3,488,619

PLUG-IN ELECTRIC CIRCUIT COMPONENT

Foster Earle Weld, Newton Highlands, Mass., assignor to E. W. Bliss Company, Canton, Ohio, a corporation of Delaware Filed Dec. 21, 1966, Ser. No. 603,567
Int. Cl. H05k *1/00;* H01r *13/50, 9/00*
U.S. Cl. 339—17 6 Claims

ABSTRACT OF THE DISCLOSURE

A plug-in electric circuit component comprising a printed circuit board one edge of which is provided with U-shaped or bifurcated formations separated by elongated grooves. Conductive material deposited on the surface of the U-shaped formations serve as terminals for the conductive lines on the board and permit quick detachable connection to terminal blocks provided with raised barriers between the adjacent terminals.

This invention relates to the electric circuit component art, and more particularly to a plug-in electric circuit component.

The present invention is particularly applicable to board-like or "printed" electric circuit components, and it will be described with particular reference thereto; however, it will be appreciated that the invention has broader applications and may be used with other types of electric circuit components.

Many conventional electric circuits require the interconnection of electrically conductive portions of a printed circuit with the terminals of a "barrier" type terminal block. A terminal block of the "barrier" type is one in which the electrically conductive terminal portions are separated from each other by electrically nonconductive, raised barrier portions. The barriers serve to prevent arcing or accidental shorting between adjacent terminal portions.

In accordance with prior art practices, this interconnection between printed circuit and barrier type terminal block has been accomplished in cumbersome, indirect manners. According to one practice, jumper wires soldered to the electrically conducting portions of the printed circuit are used to effect the interconnect. This necessitates the unsoldering of the jumper wires when it is desired to repair or replace the printed circuit.

According to another prior art practice, use is made of an intermediate terminal block which, by design, can directly engage the electrically conductive portions of the printed circuit, and then jumper wires are run from the intermediate terminal block to the barrier type terminal block. This, of course, increases the size, weight and cost of the interconnect.

The present invention obviates these and other disadvantages of the prior art by providing a novel plug-in electrical circuit component adaptable to direct interconnections between printed circuits and barrier type terminal blocks.

In accordance with one aspect of the present invention, there is provided a plug-in electric circuit component comprising a board-like member having electrically conductive portions and electrically nonconductive portions, the member having an edge portion configured to provide a plurality of electrically conductive, generally U-shaped lands, separated from each other by grooves.

In accordance with another aspect of the present invention, there is provided in combination with a "barrier" type terminal block comprising a plurality of electrically conductive terminal portions separated from each other by electrically nonconductive, raised portions; an electric circuit component as described above, wherein the U-shaped lands are received in electrical contact with the terminal portions of the terminal block, and the raised barrier portions of the terminal block are received in the grooves of the board-like member.

Therefore, an object of the present invention is to provide a plug-in electric circuit component which obviates the certain disadvantages of the prior art.

Another object of the present invention is to provide a plug-in electric circuit component of improved design.

A still further object of the invention is to provide a plug-in electric circuit component operative to be directly connected to a barrier type terminal block, thereby obviating the need for jumper wires or intermediate terminal blocks.

A still further object of the invention is to provide a novel combination of a barrier type terminal block with a plug-in electric circuit component of improved design.

These and other objects and advantages will become apparent from the following detailed description of a preferred embodiment of the invention when read in connection with the accompanying drawings, in which.

Figure 1:
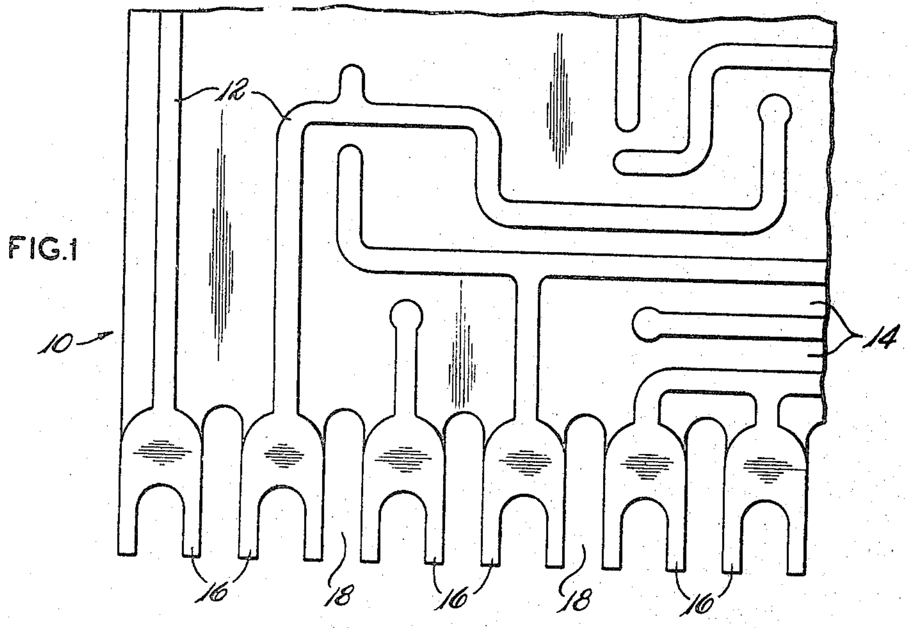
FIGURE 1 is a schematic plan view of a preferred embodiment of the invention.

Referring now to the drawings wherein the showings are for purposes of illustrating a preferred embodiment of the invention only, and not for the purpose of limiting the same, FIGURE 1 shows a plug-in electric circuit component comprising a board-like member, designated generally as 10, having electrically conductive portions 12 and electrically nonconductive portions 14. Electrically conductive portions 12 terminate at one edge portion of board-like member 10 in a plurality of electrically conductive generally U-shaped lands 16, separated from each other by a groove 18. U-shaped lands 16 and grooves 18 are dimensioned to fit the electrically conductive terminal portions and electrically nonconductive raised barrier portions, respectively, of a barrier type terminal block.

Figure 2:
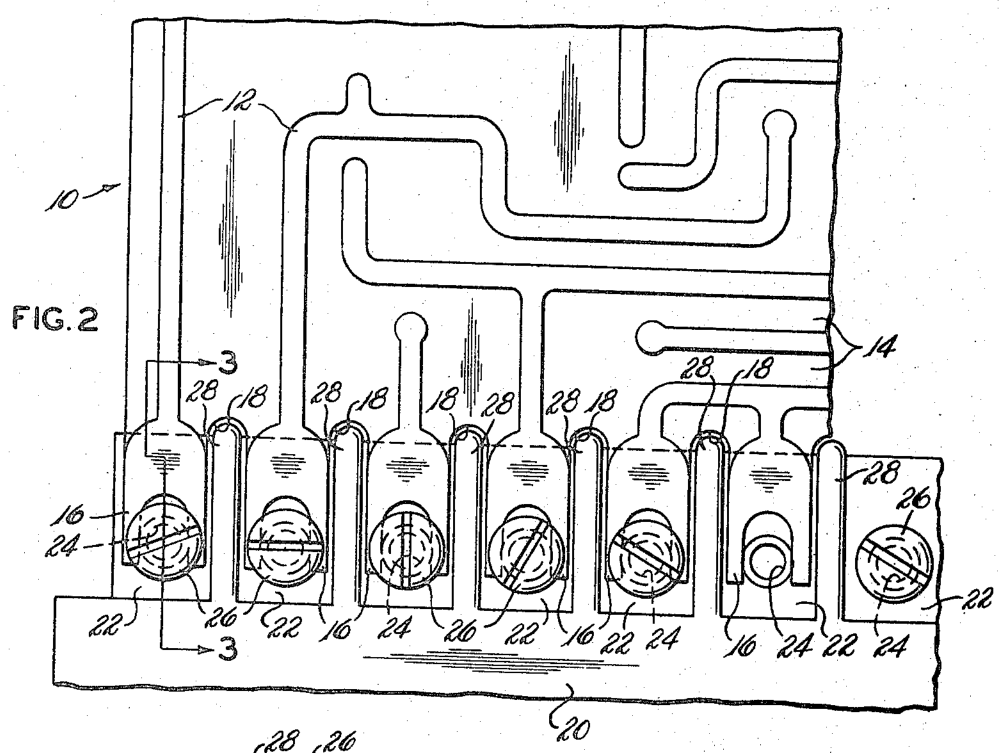
FIGURE 2 is a schematic plan view of a combination of the embodiment shown in FIGURE 1 with a barrier type terminal block.
Figure 3:
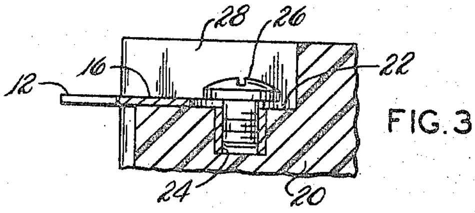
FIGURE 3 is a schematic sectional view taken generally along line 3—3 of FIGURE 2.

FIGURES 2 and 3 show a barrier type terminal block 20 comprising a plurality of electrically conductive terminal portions 22, having recesses 24 adapted to receive terminal fastening means, such as screws 26. Interposed between electrically conductive terminal portions 22 are a plurality of electrically nonconductive, raised barrier portions 28.

The distance between parallel legs of U-shaped lands 16 is slightly greater than the diameter of the shank portion of screw 26, thus the open ends of U-shaped lands 16 will receive the shank portion of screw 26. Similarly, the width of groove 18 is slightly greater than barrier portion 28, so that the groove will receive the latter.

In the arrangement shown, barrier portions 28 of terminal block 20 extend forward of terminal portions 22, so that grooves 18 of board-like member 10 are necessarily longer than the base of U-shaped lands 16 are deep. It will be understood, however, that in other terminal blocks, the barrier portions do not extend forward of the terminal portions, and in this case, the grooves need be only at least as long as the base of the U-shaped lands are deep.

Engagement between board-like member 10 and barrier type terminal block 20 is accomplished by loosening screws 26, sliding U-shaped lands 16 into electrical contact with terminal portion 22, and receiving raised barrier portions 28 in grooves 18. The interconnection is secured by tightening screws 26. In order to disconnect the board-like member 10 from barrier type terminal block 20, it is only necessary to loosen screws 26 and to withdraw board-like member 10.

The present invention has been described in conjunction with certain structural embodiments; however, it is to be appreciated that various structural changes may be made in the illustrated embodiments without departing from the intended scope and spirit of the present invention as defined in the appended claims.

Having thus described my invention, I claim:

1. A plug-in electric circuit component comprising a circuit board of insulating material having paths of electrically conductive material thereon, said circuit board terminating in U-shaped formations at one edge portion, said U-shaped formations having conductive material thereon and separated from one another by elongated grooves which extend inwardly from the edge portion of said circuit board, wherein said U-shaped formation are adapted to slidably receive the terminal portions of a barrier type terminal block and said elongated grooves are adapted to receive the raised barrier portions of said terminal block.

2. The electric circuit component as defined in claim 1, wherein said elongated grooves are at least as long as said U-shaped formation is deep.

3. The electric circuit component as defined in claim 2, wherein said elongated grooves are longer than said U-shaped formation is deep.

4. A plug-in electric circuit component for use with a barrier type terminal block of the variety having a plurality of electrically conductive, screw like terminal portions separated from each other by electrically nonconductive, raised barrier portions, comprising: a nonconductive, board like member having upper and lower surfaces; said member having at least one edge portion which projects outwardly and is configured to define a plurality of generally U-shaped lands having opposed leg portions; said leg portions being spaced apart at a preselected distance to define an inwardly extending opening therebetween adapted to receive the screw like terminal of the barrier type terminal block; said U-shaped lands being spaced apart a preselected distance to define a plurality of grooves between adjacent lands adapted to receive the raised barrier portions of the barrier type terminal block; and electrically conductive material deposited on the upper surface of said U-shaped lands, said material extending inwardly from said lands to define electrically conductive pathways on said nonconductive board like member.

5. The electric circuit component defined in claim 4, wherein said grooves are at least as long as said inwardly extending openings.

6. The electric circuit component defined in claim 5, wherein said grooves are longer than each of said inwardly extending openings.

References Cited

UNITED STATES PATENTS

| | | | |
|---|---|---|---|
| 2,377,187 | 5/1945 | Schey | 339—198 XR |
| 2,766,436 | 10/1956 | Luebking | 339—198 |
| 2,796,498 | 6/1957 | Daily et al. | 339—17 XR |
| 2,961,584 | 11/1960 | Banik et al. | 339—17 XR |

OTHER REFERENCES

IBM Technical Disclosure Bulletin, vol 5, No. 5 October, 1962.

MARVIN A. CHAMPION, Primary Examiner

PATRICK A. CLIFFORD, Assistant Examiner

U.S. Cl. X.R.

339—176, 198